United States Patent [19]
Thompson et al.

[11] Patent Number: 6,128,244
[45] Date of Patent: Oct. 3, 2000

[54] METHOD AND APPARATUS FOR ACCESSING ONE OF A PLURALITY OF MEMORY UNITS WITHIN AN ELECTRONIC MEMORY DEVICE

[75] Inventors: William N. Thompson; J. David Porter, both of Meridian; Larren G. Weber, Caldwell; John Wilford; Tom Pawlowski, both of Boise, all of Id.

[73] Assignee: Micron Technology, Inc., Boise, Id.

[21] Appl. No.: 09/090,167

[22] Filed: Jun. 4, 1998

[51] Int. Cl.[7] ................................................ G11C 8/00
[52] U.S. Cl. .......................... 365/230.03; 365/189.04; 365/230.03; 365/230.08; 365/233
[58] Field of Search ..................... 365/230.03, 230.06, 365/230.08, 189.04, 233, 230.01, 189.01

[56] References Cited

U.S. PATENT DOCUMENTS

| | | | |
|---|---|---|---|
| 5,126,975 | 6/1992 | Handy et al. ................. | 365/230.01 |
| 5,390,149 | 2/1995 | Vogley et al. ................ | 365/189.01 |
| 5,453,957 | 9/1995 | Norris et al. ................. | 365/230.04 |
| 5,463,577 | 10/1995 | Oowaki et al. ............... | 365/63 |
| 5,546,346 | 8/1996 | Agata et al. .................. | 365/203 |
| 5,559,952 | 9/1996 | Fujimoto ....................... | 395/164 |
| 5,561,636 | 10/1996 | Kirihata et al. ................ | 365/201 |
| 5,617,555 | 4/1997 | Patel et al. .................... | 395/432 |
| 5,649,172 | 7/1997 | Tang ............................. | 395/508 |
| 5,673,414 | 9/1997 | Amini et al. .................. | 395/473 |
| 5,703,813 | 12/1997 | Manning et al. .............. | 365/189.05 |
| 5,724,292 | 3/1998 | Wada ............................ | 365/207 |
| 5,732,040 | 3/1998 | Yabe ............................. | 365/230.03 |
| 5,822,268 | 10/1998 | Kirihata ........................ | 365/230.03 |

*Primary Examiner*—David Nelms
*Assistant Examiner*—Hoai V. Ho
*Attorney, Agent, or Firm*—Dickstein Shapiro Morin & Oshinsky LLP

[57] ABSTRACT

The invention provides a memory access system and method of operation particularly useful with electronic storage devices having two or more memory units. Accessing of the memory units occurs one at a time and takes place using shared resources, such as shared row and column decoders. In a preferred embodiment, the invention permits the parallel reading of data from one memory unit of a plurality of memory units during a single system clock cycle using shared resources to perform addressing (e.g., read or write access) for the memory unit. The same shared resources are then used by any one of the other memory units during a subsequent system clock cycle to perform its own access function. By reading (or writing) data from (or to) one memory unit only during a single system clock cycle, the shared row and column decoders (and their attendant address lines) become available in a subsequent system clock cycle for use by another memory unit.

54 Claims, 2 Drawing Sheets

METHOD AND APPARATUS FOR ACCESSING ONE OF A PLURALITY OF MEMORY UNITS WITHIN AN ELECTRONIC MEMORY DEVICE

BACKGROUND OF THE INVENTION

1. Field of the Invention

The invention is directed to methods and apparatus for efficiently accessing electronic memory devices.

2. Description of Related Art

With the constant increase in speed of processors and complexity of computer applications, there is an ever present need in today's computer systems to reduce any unnecessary processing delays. One technique that is commonly used for reducing the time involved in accessing semiconductor memory arrays is known as "burst access." During a burst access "read" operation, a single address is provided to a memory device on its address bus. The data word stored in the memory device at the given address is then output on a data bus. Subsequently, a predetermined number of additional data words which may, for example, be stored in the memory device at sequential addresses, are then also automatically read out in successive clock cycles over the data bus without any additional address signals being sent over the address bus. The problem inherent in such a burst scheme is that the access of the memory device is still performed one location at a time and the delay in accessing the sequential data, though improved, can still be substantial.

An alternative "burst access" scheme is also known which involves the use of extra wide data buses to increase the data rate (i.e., "bandwidth") of the memory device access. U.S. Pat. No. 5,561,636, for example, discloses a Synchronous Dynamic Random Access Memory (SDRAM) architecture that uses a wider on-chip data bus (64-bit) than its off-chip I/O bus (32-chip). The wider on-chip data bus allows simultaneous transfer (known as one form of "prefetching") of data from the memory array with sequential transfer of the data to the I/O bus devices as needed. U.S. Pat. No. 5,546,346, discloses another SDRAM architecture that utilizes a multiplexer/selector between the memory array and an external interface to facilitate the sequential transfer of data to an external device. See also U.S. Pat. No. 5,673,414 (simultaneous prefetch of 16-byte packets of contiguous data stored in a buffer and read by I/O device in 1, 2 or 4 byte sections); and U.S. Pat. No. 5,390,149 (M data bits are transferred in parallel from memory array and one-out-of-M selection of these bits is output from an internal multiplexer in response to address control signals).

A significant drawback of the burst access scheme using an extra wide data bus is the large size of the buses required to transfer data from the array to the input/output lines. Such buses can consume large amounts of die area. Where multiple memory devices are needed on a single integrated circuit, much of the die area will be consumed by the large buses required for each memory unit.

SUMMARY OF THE INVENTION

The invention provides a memory device access method and apparatus which is particularly useful with semiconductor memory devices having two or more memory units. Addressing of the memory units is provided by shared resources such as shared row and column decoders. In a preferred embodiment, the invention permits the parallel reading of data from one memory unit of a plurality of memory units during a single system clock cycle using shared resources to perform addressing (e.g., read or write access) for the memory unit. The same shared resources are then used by any one of the other memory units during a subsequent system clock cycle to perform its own access function.

By reading (or writing) data from (or to) one memory unit during a single system clock cycle, the shared row and column decoders (and their attendant address lines) become available in a subsequent system clock cycle for use by another memory unit. Sharing resources in this manner reduces the die area required for fabrication of each memory unit in the memory access system and increases the memory "bandwidth" (i.e., rate at which data is read from (or written to) memory) of the system.

The foregoing and other features and advantages of the invention will become more apparent from the following detailed description of the preferred embodiment of the invention which is provided with reference to the accompanying drawings.

DETAILED DESCRIPTION OF PREFERRED EMBODIMENTS

The invention will be described in detail with reference to the preferred embodiment illustrated in FIGS. 1 and 2. Although this embodiment depicts the invention in its preferred application to a static random access memory (SRAM) device, the invention may be applicable to any type or configuration of memory unit (e.g., dynamic random access memory (DRAM), read only memory (ROM), bubble memory, etc.), as well as any other memory device that requires a similar access.

Figure 1:
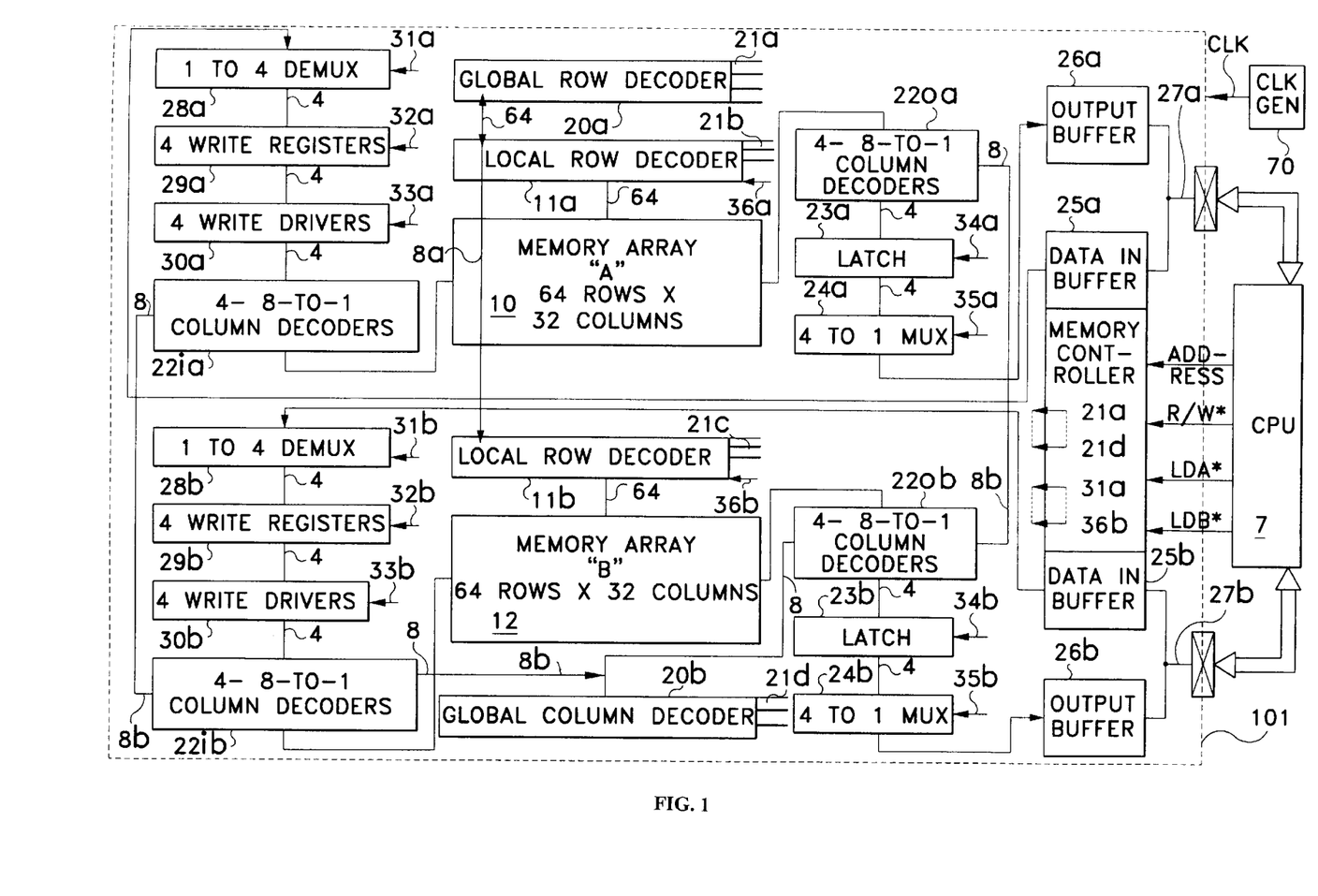
FIG. 1 illustrates a block diagram of the memory access system in accordance with a preferred embodiment of the invention.

As shown in FIG. 1, a semiconductor memory device 101 has two or more discrete memory units 10, 12. As used herein, the memory units 10, 12 are assumed to be in the form of static random access memories (SRAMs) which are fabricated together in the semiconductor memory device 101 with shared resources as described below. Each memory unit 10, 12 has at least one respective memory array (A, B) for storing a plurality of data words in a matrix of row and column addresses. In the preferred embodiment, two memory units 10, 12 are used which, for the sake of simplicity, are shown each containing a memory array having 64 rows and 32 columns divided into four subsections each containing 8 columns for storing data words that each contain one bit of information; however, the number of rows, columns, and subsections (if any) in each array may be varied, each data word may contain more than one bit of information, and each array may have a different number of rows and columns, as desired. In addition, more than two memory units 10, 12 can be used.

To facilitate addressing of the memory arrays, a single shared or global row decoder 20a is fabricated on the IC. Global row decoder 20a receives system address signals 21a (or a subset thereof) as sent by memory controller 17, either in the initial form as input from CPU 7, or in a "predecoded" state (i.e., converted into information identifying a particular row or group of rows intended to be accessed). When global row decoder 20a recognizes an address for memory locations it services, the given row address is sent by global row decoder 20a to all of the memory units 10, 12 in the system using shared row decode lines 8a which connect global row decoder 20a to each memory unit 10, 12.

The shared row decode lines 8a are coupled to a plurality of local row decoders 11a, 11b, each associated with an individual memory unit 10, 12 of the system. Individual local row decoders 11a, 11b are used to access an associated one of memory units 10, 12 at the row address provided by the global row decoder 20a in response to an appropriate enable signal 36a, 36b from memory controller 17. Local row decoders 11a, 11b may also serve to further decode the address provided by the global row decoder 20a by combining this address with additional address information 21b, 21c to effectively multiply the number of addressable locations of its memory unit 10, 12 in a manner well known in the art. This additional decoding function is typically used when the memory units 10, 12 have different address spaces and capacities.

In the embodiment shown in FIG. 1, each local row decoder 11a, 11b receives the row address information from the shared row decode lines 8a, as well as an enable signal from memory controller 17. Memory controller 17 generates enable signals and other control signals to permit individual ones of the memory units 10, 12 to achieve an exclusive memory access at a given system clock cycle. In the preferred embodiment, each system clock cycle contains one clock period, as shown in the clock timing diagram in FIG. 2, and may be generated by clock generator 70 shown in FIG. 1. Based on the input signals from row decode lines 8a and the controller 17, each local row decoder 11a, 11b can select a specific row for its associated memory unit 10, 12 during its exclusive period of memory access.

A single shared global column decoder 20b is also provided for receiving system address information 21d and deriving column address information identifying a column address to be used in accessing arrays A, B. The column address is transmitted to each of the memory units 10, 12 over shared column decode lines 8b to complete the address of an accessed data word stored in one of the memory arrays A, B.

In accordance with the invention, memory controller 17 provides exclusive enable signals 36a, 36b to local row decoders 11a, 11b during separate system clock cycles to provide memory access to memory units 10, 12 one at a time. When the semiconductor memory device 101 has two memory units 10, 12, this memory access may be alternative; that is, memory access may alternate between memory units 10 and 12. When there are more than two memory units in the semiconductor memory device 101, access to a memory unit is one at a time, which may result in sequential access or access in some other fixed, changeable, or arbitrary pattern.

Input-output (I/O) bus lines 27a, 27b (or other like data paths) are provided to facilitate the transfer of data words read from (and written to) memory units 10, 12. In the preferred embodiment, CPU 7 is coupled to I/O bus lines 27a, 27b. CPU 7 is shown externally located from the semiconductor memory device 101 containing memory units 10, 12. CPU 7, however, may be fabricated on the same integrated circuit as memory units 10, 12 where a single chip computer is used to implement the invention.

CPU 7 may be any processing device requiring access to memory for performing the function of reading, writing, or both. CPU 7, for example, may be a general computer processor that stores executable program instructions in memory unit 10 and stores processed data in memory unit 12. CPU 7 may further include a cache mechanism which prefetches executable instructions from memory unit 10 and performs a fast write to memory unit 12. CPU 7 may alternatively be a network computer that stores Internet Protocol (IP) addresses or other routing information in memory unit 10 with data packets for network applications being stored in memory unit 12. Moreover, CPU 7 may embody (or provide an output for) the memory controller 17 used to control memory access to individual memory units 10, 12. As shown in FIG. 1, CPU 7 outputs to the memory access system command signals such as "Address," "R/W*," "LDA*," and "LDB*," as will be described below with reference to FIG. 2. Many other arrangements are also possible as understood by those skilled in the art.

In accordance with the invention, memory units 10, 12 are accessed individually in different single system clock cycles, which permits memory units 10, 12 to share various resources. In the preferred embodiment, memory units 10, 12 share global row and column decoders 20a, 20b, together with global address or word lines (e.g., 64 global row decode lines 8a and 8-global column decode lines 8b). As previously described, global row and column decoders 20a, 20b receive system address signals 21a, 21d (or subsets thereof) and send signals identifying the desired row and column addresses, respectively, over global row and column decode lines 8a, 8b.

Global row decode lines 8a are commonly coupled to each of the local row decoders 11a, 11b associated with the memory units 10, 12 in the system. Local row decoders 11a, 11b may also receive signals 21b, 21c which may be address signals (or a subset thereof) to further decode the row address signals sent by global row decoder 20a. An enable signal 36a, 36b will also be input by local row decoders 11a, 11b as output by memory controller 17. Based on the input signals received, each local row decoder 11a, 11b will send a row address signal over the 64 address lines connecting the local row decoder to its individually associated memory unit so as to identify which row address in the memory array is to be accessed. In the illustrative embodiment, the memory arrays A, B have the same dimensions and thus the row address output by local row decoders 11a, 11b, in response to address signals from global row decoder 20a and column decoder 20b, will be the same in both memory units 10, 12.

However, because the memory controller will send enable signals to local row decoders 11a, 11b in different system clock cycles, as discussed above, even though both memory units 10, 12 receive identical row addresses only one will be accessed at a time under control of the enable signal. The enable signals may trigger access to a given memory unit during any cycle that no other memory unit will be using the shared resources. The enable signals may, for example, provide routine cyclical access to individual memory units at select intervals (i.e., a different unit at different system clock cycles).

The 8-column decode lines 8b carrying the global column address information output from global column decoder 21d are fed to each of the local column decoders (i.e., input column decoders 22ia, 22ib, as well as output column decoders 22oa, 22ob) associated with individual memory units 10, 12. The column decoders 22ia, 22oa, 22ib, 22ob are illustrated as 8-to-1 column decoders used to select a column address based on address information sent over the 8-column decode lines 8b. This is because, as noted above, each memory unit 10, 12 is divided into four subsections, each having 8 column lines. (Although the illustrated embodiment utilizes 8-to-1 decoders, any $2^m$-to-1 decoder (where m is a non-negative integer) or an equivalent may be used.) In the illustrated embodiment, the column decoders 22i*a*, 22o*a*, 22i*b*, 22o*b* each include four different 8-to-1 decoders respectively addressing four different sections (8 columns per section) of a single memory array. A single column address provided by global column decoder 20*b* is simultaneously sent to each of the 8-to-1 decoders such that the same column address identified on global column decode lines 8*b* corresponds to four different columns, one for each memory subsection and thus, four different 1-bit data words can be accessed at the same time in each of the memory arrays A or B.

The access to memory arrays A, B in each memory unit is to a plurality of data words, e.g., four, in parallel in both read and write modes. In the read mode, the row and column addresses output from local row decoders 11*a*, 11*b* and output from column decoders 22o*a*, 22o*b* represent the address of the block of four data words that is to be read from the enabled memory unit 10, 12. As will be described in more detail with reference to FIG. 2, during the appropriate system clock cycle, the four data words stored in the enabled memory unit at the selected row and column address are latched in parallel by latching devices 23*a*, 23*b*. Latching devices 23*a*, 23*b* contain four banks of sense amplifiers activated by enable signals 34*a*, 34*b* issued by memory controller 17. Other known sensing and latching structures may also be used, however. To convert the latched data words into a serial format for output over I/O bus lines 27*a*, 27*b*, multiplexers 24*a*, 24*b* (preferably in the form of 4-to-1 multiplexers) are used. Enable signals 35*a*, 35*b* output by memory controller 17 ensure that multiplexers 24*a*, 24*b* take the four parallel data words from latching devices 23*a*, 23*b* and sequentially output each data word in four successive system clock cycles. Output buffers 26*a*, 26*b* may be used to temporarily store the newly serialized data words prior to sending them over I/O bus lines 27*a*, 27*b* in the case of a pipeline part or the like.

During a write mode, "data in" buffers (also referred to as "input buffers") 25*a*, 25*b* are coupled to I/O bus lines 27*a*, 27*b* to temporarily store a block of four serial data words that are to be written into one of the memory units 10, 12. Although input buffers 25*a*, 25*b* are shown incorporated within memory controller 17, the input buffers may alternatively be external to memory controller 17. The input block of data words is output from input buffers 25*a*, 25*b* and taken by demultiplexers 28*a*, 28*b* (preferably in the form of 1-to-4 demultiplexers) for conversion into four word parallel data under control of enable signals 31*a*, 31*b* output from memory controller 17. The four parallel data words output from demultiplexers 28*a*, 28*b* are stored in write registers 29*a*, 29*b*, where they are stored under control of enable signals 32*a*, 32*b* output from memory controller 17 until the desired memory unit 10, 12 is activated. Once the memory unit is enabled, write drivers 30*a*, 30*b* (under control of enable signals 33*a*, 33*b* issued by memory controller 17) are used to take the parallel data words from write registers 29*a*, 29*b* and drive the data lines of the enabled memory array (A, B) corresponding to the address identified by local row decoders 11*a*, 11*b* and input column decoders 22i*a*, 22i*b* so as to perform a parallel write of the block of four input data words in the enabled memory unit.

Figure 2:
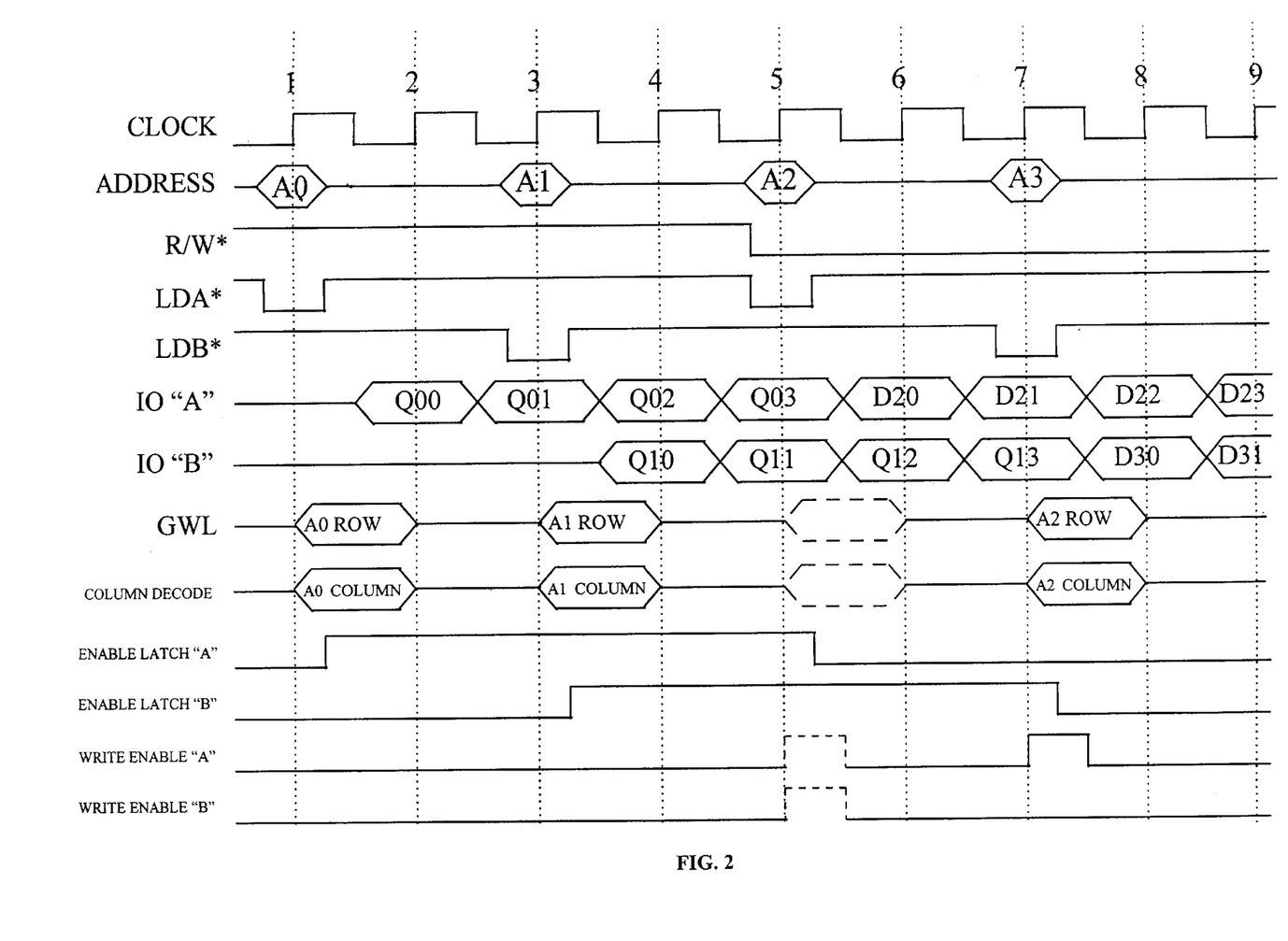
FIG. 2 is a timing diagram showing operation of the preferred embodiment shown in FIG. 1.

A timing diagram for an exemplary operation of the memory access system is provided in FIG. 2 to further illustrate the operation of a preferred embodiment of the invention.

The figure illustrates the sequential access of memory arrays A and B, which permits the sharing of resources such as global row decoder 20*a* and global column decoder 20*b*. Four memory access operations are shown: first, a read operation from an address of array A derived from system address signal A0; second, a read operation from an address of array B derived from system address signal A1; third, a write operation to an address of array A derived from system address signal A2; and fourth, a write operation to an address of array B derived from system address signal A3. However, it should be understood that the invention may perform a read access of one memory unit and then a read access of another memory unit, a write/write access to the two memory units, or a write/read access to the memory units, or a read/write access to memory units 10, 12.

FIG. 2 also illustrates a preferred mode of operation of the invention known in the art as a "late write" operation, where the data to be written into memory arrives one clock cycle later than the address and control information corresponding to the location in memory in which the data is to be stored. This particular "late write" operation is also known as a "buffered write" operation. The "buffered write" operation involves, during an initial write cycle, the transmission of address and data information to semiconductor memory device 101 from an external source such as CPU 7 for storage in a memory array, e.g., array A or B. Both the address and data information received by semiconductor memory device 101 are stored in a memory buffer (preferably, contained within memory controller 17) rather than being directly input into memory array A or B. The buffered data words are subsequently written during the next write cycle into memory array A or B for storage at a location in the array derived from the buffered address. During this same subsequent system clock cycle, additional write address and data word information are input for "buffering" prior to writing into memory array A or B.

As depicted in FIG. 2, a clock provides timing signals representing the various clock cycles in the system. These timing signals will be provided by a clock generator FIG. 1 directly or indirectly as required to many of the elements shown in FIG. 1, as should be understood by those of ordinary skill in the art. At cycles 1, 3, 5 and 7, different system address signals A0, A1, A2 and A3, respectively, are input to the semiconductor memory device 101 from an external source such as CPU 7. As noted above, these address signals (or various subsets) will appear as decoded address lines 21*a*–21*d* and will be used by the row decoders (both global and local row decoders) and column decoders to designate an appropriate row and column address for the memory access of one of the memory units 10, 12.

During cycle 1 in this example, a read operation from memory unit 10 (with memory array A) is to be performed. This operation is initiated by the HIGH state of the read/write (R/W*) mode signal and the transition of the normally HIGH state of the load array A (LDA*) signal to its LOW state. Both of these signals are issued by CPU 7 and received by memory controller 17. The R/W* mode signal is used by memory controller 17, together with the LDA* signal and the load array B (LDB*) signal to enable the appropriate ones of elements 23*a*, 23*b*, 24*a*, 24*b*, 28*a*, 28*b*, 29*a*, 29*b*, 30*a*, and 30*b* of the system used during read/write operations. For example, R/W* signals are input to memory controller 17, together with address signal A0 and the LDA* signal causing memory controller 17 to generate a corresponding Enable Latch signal 34*a* to activate latch 23*a* so as to latch data words read from memory unit 10 during a "read" operation of memory array A. Also during cycle 1, the LDB* signal remains in its normal HIGH state, indicating that no access to memory array B (or usage of shared resources such as global row decoder 20a for memory array B) is made at this time.

During cycle 1, the row address information, which is derived from A0, is output by global row decoder 20a and sent over global row decode lines 8a (also referred to as "global word lines (GWL)"), while the column address information (also derived from A0) is sent over global column decode lines 8b by global column decoder 20b. The four data words stored at the address derived from address A0 in memory array A during this memory access in cycle 1 are thus output to the sense amplifier and latching device 23a through output column decoders 22oa. Once the Enable Latch signal 34a activates latch 23a, the four output data words are sensed in parallel and latched in latching device 23a. The latch 23a is particularly shown here as remaining activated by Enable Latch signal 34a until the data words are read out to I/O bus lines 27a. After receiving an enable signal 35a from memory controller 17, multiplexer 24a outputs, during successive clock cycles 2–5, the data words (Q00, Q01, Q02, Q03) serially over I/O bus line 27a through output buffer 26a to CPU 7.

During cycle 3 a similar read operation from memory unit 12 (with memory array B) is to be performed. This operation is initiated by the HIGH state of the read/write (R/W*) mode signal and the transition of the normally HIGH state of the load array B (LDB*) signal to its LOW state. Both of these signals are issued by CPU 7 and received by memory controller 17. Also during cycle 3, the LDA* signal remains in its normal HIGH state, indicating that no access to memory array A (or usage of shared resources such as global row decoder 20a for memory array A) is made at this time.

During cycle 3, the row address information, which is derived from A1, is output by global row decoder 20a and sent over GWL, while the column address information (also derived from A1) is sent over global column decode lines 8b by global column decoder 20b. The four data words stored at the address derived from address A1 in memory array B during this memory access in cycle 3 are thus output to the sense amplifier and latching device 23b through output column decoders 22ob. Once the Enable Latch signal 34b activates latch 23b, the four output data words are sensed in parallel and latched in latching device 23b. The latch 23b is particularly shown here as remaining activated by Enable Latch signal 34b until the data words are read out to I/O bus lines 27b. After receiving an enable signal 35b from memory controller 17, multiplexer 24b outputs, during successive clock cycles 4–7, the data words serially over I/O bus line 27b through output buffer 26b to CPU 7.

During clock cycle 5 in this example, a write operation to be performed on memory unit 12 is communicated to memory controller 17. In accordance with this operation, the R/W* signal transitions to a LOW state, and the load array A (LDA*) signal transitions to an active LOW state so as to inform memory controller 17 of the desire to perform write access on memory array A at an address derived from system address signal A2. During successive cycles 6–9, the four data words (D20, D21, D22, D23) desired to be stored at a location in memory array A derived from system address signal A2 is received over I/O bus line 27a. Because the semiconductor memory device is operating in a "buffered write" mode in this exemplary embodiment, memory controller 17 temporarily stores address A2 and data words D20–D23 in buffer 25a instead of accessing memory array A and writing the data words directly into memory array A. While receiving the input data words D20–D23 (i.e., in cycles 6–9), the data words D20–D23 are output to demultiplexer 28a where the 1-to-4 demultiplexer converts the single serial stream of data words into a parallel block of 4 data words in response to enable signal 31a output by memory controller 17. Enable signal 32a output by memory controller 17 is effective in causing the 4 write registers 29a to store the 4 parallel data words until the next subsequent write operation.

The "buffered write" operation will also, during cycle 5, allow previously input data words already stored in write registers 32a or 32b as a result of a previous write operation to be written into memory array A or B. As shown by the phantom write enable signals (represented by dashed lines) in cycle 5, address signals corresponding to the previously stored data words are sent over global word lines 8a and column decode lines 8b. Local row decoder 11a or 11b and input column decoders 22ia or 22ib determine the address location of array A or B for which the 4 write drivers 30a or 30b will write the previously input data words in memory array A or B in response to Write Enable signal 33a or 33b issued by memory controller 17.

Similarly, in cycle 7, a new write operation intended to be a write of newly input data words (D30, D31, etc.) to memory array B at a location in memory array B derived from system address signal A3, as indicated by the transition to a LOW state by the R/W* signal and the LOW state transition by the LDB* signal, will trigger the actual writing of previously stored data words D20–D23 in memory array A at an address location derived from the previously stored address A2. As shown, during cycle 7, the row (A2-Row) and column (A2-Column) address information derived from address A2 is output on global word lines 8a and column decode lines 8b, and Write Enable signal 33a is raised to its active HIGH state by memory controller 17. The transition of the Write Enable signal 33a activates write drivers 30a to write the parallel data words stored in write registers 29a into memory array A at the row and column address dictated by local row decoder 11a and input column decoder 22ia.

As noted above, due to the "buffered write" operation, the newly input address information (A3) and the data words (D30, D31, etc.) will be input in the next four successive cycles (i.e., cycles 8, 9, etc.) and stored for use during the next subsequent write operation.

As is apparent from the above detailed description, by reading (or writing) data from (or to) one memory unit during an initial single system clock cycle, the shared global row and column decoders (and their attendant address lines) can easily be used in a subsequent system clock cycle by another memory unit while the one memory unit completes its accessing functions. Sharing resources in this manner, reduces the die area required for fabrication of the memory units of the memory access system and increases the memory "bandwidth" (i.e., rate at which data is read from (or written to) memory).

While the invention has been described in detail in connection with the best mode of the invention currently known, it should be readily understood that the invention is not limited to the specified embodiment described. Rather, the invention can be modified to incorporate any number of variations, alterations, substitutions or equivalent arrangements not heretofore described, but that are commensurate with the spirit and scope of the invention.

For example, although the detailed description of the preferred embodiment described the use of only two memory units in the memory access system of the invention, any number n of memory units (where n is an integer greater than one) may be employed. The memory units may also contain one or more arrays that store data words having any number of bits (1, 2, 4, 8, etc.), e.g., one memory unit may contain an array storing 4 bit data words, while another memory unit may contain an array storing 1 bit data words. Because the memory arrays are partitioned in physically separate or discrete memory units, the arrays may be of different dimensions and capacities (e.g., memory unit 10 containing an array of 128K rows and 36 columns storing 4-bit data words in four subsections of the array; memory unit 12 containing an array of 16K rows and 8 columns storing data words 1 bit long in only 1 subsection). Furthermore, the I/O bus lines may be single or multiple bits wide and may support transfer of one or more bytes at a time. The 4-to-1 MUXs 35a, 35b illustrated in FIG. 1 may similarly be changed in size as required for the application desired. A clock may be provided by CPU 7 or any external device directly to the memory access system, or alternatively, may be fabricated on the same IC as the memory access system.

In addition, in another preferred embodiment, various degrees of segmentation can be added to the basic addressing scheme illustrated herein. For example, memory array A may be a matrix of 512 rows and 512 columns, while memory array B may be a matrix of 512 rows and 9216 segmented columns. The 9216 columns are segmented in that only 2304 of these columns are accessed at a time. To support this segmentation, 288 8-to-1 column decoders and 36 8-to-1 MUXs would be required. To further reduce the number of output lines of memory array B, an additional 2-to-1 MUX could be supplied between the 8-to-1 MUXs and the output buffer to reduce the data stream to 18 bits. On the input side of memory array B, a similar 2-to-1 MUX could be added between the input buffer and the 1-to-8 DEMUXs. Where memory array A outputs only a single word, a 1-to-1 MUX would be used and no additional MUXs would be required.

Other resources that may be shared in addition to (or in lieu of) the shared row and column decoders, include local input/out put column decoders, clock generators for address or data, row/column redundancy, etc. Beyond the single data rates shown herein, other data rates such as the well-known "double" data rate operations may be used when implementing the invention. While only the "late write" embodiment has been described, other modifications that may be made when implementing the invention include the use of the known "early" or "zero bus turnaround" components in combination with "buffered write" operations, which provide the data to be written in a system clock cycle at various clock edges with respect to the address and control signals of the memory units; and the combining of multiple elements (e.g., input and output column decoders) into a single element. In view of the many other modifications which can be made, the nature, spirit and scope of the invention is not to be considered as limited by the foregoing description but is only limited by the scope of the claims appended hereto.

What is claimed as new and desired to be protected by Letters Patent of the United States is:

1. An electronic storage device comprising:
    a plurality of memory units, each memory unit having at least one array for storing data;
    a shared decoder, coupled to each of said memory units through a plurality of address lines, said shared decoder decoding signals on said address lines and providing decoded address selection signals; and
    a plurality of local decoders respectively associated with said memory units, each local decoder receiving decoded address selection signals from said shared address decoder, and providing decoder memory access signals for an associated memory unit, said local decoders being selectively enabled by respective enable signals; and
    a circuit for supplying an enable signal to one of said local decoders at a time, wherein a first enable signal is provided to enable a memory access of a first one of said plurality of memory units during an initial system cycle, and a second enable signal is provided to a second one of said plurality of memory units during a subsequent system cycle while the first one of said plurality of memory units completes its memory access.

2. The electronic storage device as in claim 1, wherein said shared decoder is a shared row decoder and said local decoders are local row decoders.

3. The electronic storage device as in claim 2, further comprising a shared column decoder, coupled to each of said memory units, said shared column decoder designating a column address of at least one data word stored in said memory units.

4. The electronic storage device as in claim 3, further comprising a plurality of local column decoders respectively associated with said memory units, each local column decoder being coupled to receive column address selection signals from said shared column decoder.

5. The electronic storage device as in claim 1, wherein said shared decoder is a shared column decoder and said local decoders are local column decoders.

6. The electronic storage device as in claim 1, wherein each memory unit has an associated write register for storing data words to be written into the memory unit.

7. The electronic storage device as in claim 1, further comprising a plurality of input-output data paths individually associated with respective ones of said memory units, wherein the data words read from an enabled memory unit are output sequentially over an associated input-output data path, and the data words to be stored in an enabled memory unit are input sequentially through an associated input-output data path.

8. The electronic storage device as in claim 7, wherein the data words are read from an enabled memory unit in parallel and are output sequentially over an associated input-output data path.

9. The electronic storage device as in claim 7, wherein the data words to be stored in an enabled memory unit are input sequentially through an associated input-output data path and written in parallel into an enabled memory unit.

10. An electronic storage device comprising:
    a plurality of memory units each member unit having at least one array for storing data;
    a shared decoder, coupled to each of said memory units through a plurakity of address lines, said shared decoder decoding signals on said address lines and providing decoded address selection signals, wherein said shared decoder is a shared row decoder and said local decoders are local row decoders;
    a plurality of local decoders respectively associated with said memory units, each local decoder receiving decoded address selection signals from said shared address decoder, and providing decoder memory access signals for an associated memory unit, said local decoders being selectively enabled by respective enable signals;
    a circuit for supplying an enable signal to one of said local decoders at a time; and a clock generator providing timing signals representing a plurality of system clock cycles;

wherein a first one of said plurality of local row decoders enabling access to a first one of said memory units during a first clock cycle, and a second one of said local row decoders enabling access to a second one of said memory units during a second clock cycle.

11. The electronic storage device as in claim 10, wherein at least one data word is read from the first memory unit during the first clock cycle and at least one data word is written to the second memory unit during the second clock cycle.

12. The electronic storage device as in claim 10, wherein at least one data word is written into the first memory unit during the first clock cycle and at least one data word is read from the second memory unit during the second clock cycle.

13. The electronic storage device as in claim 10, wherein at least one data word is read from the first memory unit during the first clock cycle and at least one data word is read from the second memory unit during the second clock cycle.

14. The electronic storage device as in claim 10, wherein at least one data word is written into the first memory unit during the first clock cycle and at least one data word is written to the second memory unit during the second clock cycle.

15. The electronic storage device as in claim 10, wherein a plurality of data words are read from an enabled memory unit in parallel.

16. The electronic storage device as in claim 10, wherein a plurality of data words are written to an enabled memory unit in parallel.

17. An electronic storage device comprising:

a plurality of memory units, each memory unit having at least one array for storing data;

a shared decoder, coupled to each of said memory units through a plurality of address lines, said shared decoder decoding signals on said address lines and providing decoded address selection signals, wherein said shared decoder is a shared row decoder and said local decoders are local row decoders;

a shared column decoder, coupled to each of said memory units, said shared column decoder designating a column address of at least one data word stored in said memory units;

a plurality of local decoders respectively associated with said memory units, each local decoder receiving decoded address selection signals from said shared address decoder, and providing decoder memory access signals for an associated memory unit, said local decoders being selectively enabled by respective enable signals;

a plurality of local column decoders respectively associated with said memeory units, each local column decoder being coupled to receive column address selection signals from said shared column decoder; and a circuit for supplying an enable signal to one of said local decoders at a time;

wherein said local column decoders are comprised of local input column decoders and physically separate local output column decoders for each memory unit.

18. A computer system comprising:

a plurality of selectable memory units;

a first shared decoder receiving a first subset of system address signals designating a row address of a block of data stored in said plurality of memory units;

a second shared decoder receiving a second subset of system address signals designating a column address of a block of data stored in said memory units;

a plurality of input registers respectively associated with said plurality of memory units for storing data to be written in parallel into an associated memory unit;

a plurality of input bus lines respectively coupled to said input registers, each input bus line providing an input for the data stored in a respective one of said input registers;

a plurality of output registers respectively associated with said plurality of memory units for storing data read from an associated memory unit;

a plurality of output bus lines respectively coupled to said output registers, each output bus line providing an output of the data stored in a respective one of said output registers; and a central processing unit performing a memory access of a selected one of said plurality of memory units through said input and output bus lines while memory access of another of said plurality of memory units is being completed.

19. The computer system as in claim 18, further comprising n selectable memory units, each coupled to both said first shared decoder and said second shared decoder, each memory unit having at least one memory array storing data addressable by the row and column addresses designated by said first shared decoder and said second shared decoder, respectively, wherein n is an integer greater than one.

20. The computer system as in claim 19, wherein at least one of the n memory units is a static random access memory unit.

21. The computer system as in claim 1, wherein data words are written into the first memory unit during the first clock cycle and data words are read from the second memory unit during the second clock cycle.

22. A computer system comprising:

a plurality of selectable memory units;

a first shared decoder receiving a first subset of system address signals designating a row address of a block of data stored in said plurality of memory units;

a second shared decoder receiving a second subset of system address signals designating a column address of a block of data stored in said memory units;

a plurality of input registers respectively associated with said plurality of memory units for storing data to be written in parallel into an associated memory unit;

a plurality of input bus lines respectively coupled to said input registers, each input bus line providing an input for the data stored in a respective one of said input registers;

a plurality of output registers respectively associated with said plurality of memory units for storing data read from an associated memory unit;

a plurality of output bus lines respectively coupled to said output registers, each output bus line providing an output of the data stored in a respective one of said output registers;

a central processing unit performing a memory access of a selected one of said plurality of memory units through said input and output bus lines;

a clock generator providing timing signals representing a plurality of system clock cycles; and a memory controller for selectively enabling access to individual ones of said memory units;

wherein a first one of said plurality of selectable memory units is selected by said memory controller for reading or writing data words from or to the first memory unit during a first clock cycle, and a second one of said plurality of selectable memory units is selected by said memory controller for writing or reading data words to or from the second memory unit during a second clock cycle.

23. The computer system as in claim 22, wherein data words are read from the first memory unit during the first clock cycle and data words are written to the second memory unit during the second clock cycle.

24. The computer system as in claim 22, further comprising: a plurality of input-output data paths individually associated with respective ones of said memory units, wherein the data words read from an enabled memory unit are output sequentially over an associated input-output data path, and the data words to be stored in an enabled memory unit are input sequentially through an associated input-output data path and temporarily stored in a buffer memory of said memory controller.

25. The computer system as in claim 21, wherein the data words are read from an enabled memory unit in parallel and are output sequentially over an associated input-output data path.

26. The computer system as in claim 21, wherein the data words to be stored in an enabled memory unit are input sequentially through an associated input-output data path and written in parallel into an enabled memory unit.

27. A memory access system comprising:
a first memory unit having memory cells that store data words arranged in a first array, the first array containing a plurality of sections organized with first rows and first columns;
a first local row decoder, coupled to said first memory unit, receiving row address information from shared row decode lines, and selecting one of the first rows of each section of the first array during memory access of said first memory unit;
a second memory unit having memory cells that store data words arranged in a second array, the second array containing a plurality of sections organized with second rows and second columns;
a second local row decoder, coupled to said second memory unit, receiving row address information from the shared row decode lines, and selecting one of the second rows of each section of the second array during memory access of said second memory unit;
a shared row decoder, coupled to both said first local row decoder and said second local row decoder through the shared row decode lines, said shared row decoder receiving a first subset of system address signals and transmitting row address information over the shared row decode lines to said first and second local row decoders;
wherein said first local row decoder, in response to a second subset of system address signals and the row address information from the shared row decode lines, selects one of the first rows of each section of the first array and effects a memory access of said first memory unit; and
wherein said second local row decoder, in response to a third subset of system address signals and the row address information from the shared row decode lines, selects one of the second rows of each section of the second array and effects a memory access of said second memory unit before the memory access of said first memory unit is completed.

28. The memory access system as in claim 27, further comprising:
a first output column decoder, coupled to said first memory unit, receiving column address information from shared column decode lines, and selecting at least one of the first columns of each section of the first array during memory access of said first memory unit;
a first latch, coupled to said first memory unit, having sense amplifiers which are coupled to first output data lines of said first memory unit, said first latch sensing and latching in parallel a first plurality of data words stored in each section of the first array at the first row and first columns respectively selected by said first local row decoder and first output column decoder;
a first multiplexer, coupled to said first latch, receiving in parallel the first plurality of data words latched in said first latch and serially outputting the first plurality of data words; and
a first output buffer, coupled to said first multiplexer, receiving the first plurality of data words serially output from said first multiplexer, and temporarily storing the first plurality of data words prior to output of the first plurality of data words on a first input-output data path.

29. A memory access system comprising:
a first memory unit having memory cells that store data words arranged in a first array, containing a plurality of sections organized with first rows and first columns;
a first local row decoder, coupled to said first memory unit, receiving row address information from shared row decode lines, and selecting one of the first rows of each section of the first array during memory access of said first memory unit;
a second memory unit having memory cells that store data words arranged in a second array, the second array containing a plurality of sections organized with second rows and second columns;
a second local row decoder, coupled to said second memory unit, receiving row address information from the shared row decode lines, and selecting one of the second rows of each section of the second array during memory access of said second memory unit;
a shared row decoder, coupled to both said first local row decoder and said second local row decoder through the shared row decode lines, said shared row decoder receiving a first subset of system address signals and transmitting row address information over the shared row decode lines to said first and second local row decoders;
wherein said first local row decoder, in response to a second subset of system address signals and the row address information from the shared row decode lines, selects one of the first rows of each section of the first array and effects a memory access of said first memory unit;
wherein said second local row decoder, in response to a third subset of system address signals and the row address information from the shared row decode line, selects one of the second rows of each section of the second array and effects a memory access of said second memory unit;
a first output column decoder, coupled to said first memory unit, receiving column address information from shared column decode lines, and selecting at least one of the first columns of each section of the first array during memory access of said first memory unit;

a first latch, coupled to said first memory unit having sense amplifiers which are coupled to first output data lines of said first memory unit, said first latch sensing and latching in parallel a first plurality of data words stored in each section of the first array at the first row and first columns respectively selected by said first local row decoder and first output column decoder;

a first multiplexer, coupled to said first latch, receiving in parallel the first plurality of data words latched in said first latch and serially outputting the first plurality of data words;

a first output buffer, coupled to said first multiplexer, receiving the fist plurality of data words serially output from said first multiplexer, and temporarily storing the first plurality of data words prior to output of the first plurality of data words on a first input-output data path;

a first input buffer, coupled to the first input-output data path, receiving and temporarily storing a first serial input block of data words;

a first demultiplexer, coupled to said first input buffer, serially receiving the first serial input block of data words from said first input buffer and generating a corresponding first parallel input block of data words;

a plurality of first write registers, coupled to said first demultiplexer, storing the first parallel input block of data words;

a plurality of first write drivers, coupled to said first write registers, generating a first parallel block of write data words from the first parallel input block of data words stored in said first write registers; and a first input column decoder, coupled to said first write drivers and said first memory unit, receiving column address information from the shared column decode lines, and selecting at least one of the first columns of each section of the first array, together with one of the first rows of each section of the first array during memory access of said first memory unit as an address for storing the first parallel block of write data words in the first array.

30. The memory access system as in claim 29, further comprising:

a second output column decoder, coupled to said second memory unit, receiving column address information from the shared column decode lines, and selecting at least one of the second columns of each section of the second array during memory access of said second memory unit;

a second latch, coupled to said second memory unit, having sense amplifiers, coupled to second output data lines of said second memory unit, said second latch sensing and latching in parallel a second block of data words stored in the second array at the second row and second column of each section respectively selected by said second local row decoder and second output column decoder;

a second multiplexer, coupled to said second latch, receiving in parallel the second block of data words latched in said second latch and serially outputting the second block of data words; and a second output buffer, coupled to said second multiplexer, receiving the second block of data words serially output from said second multiplexer, and temporarily storing the second block of data words prior to output of the second plurality of data words on a second input-output data path.

31. The memory access system as in claim 30, further comprising:

a second input buffer, coupled to the second input-output data path, receiving and temporarily storing a second serial input block of data words;

a second demultiplexer, coupled to said second input buffer, serially receiving the second serial input block of data words from said second input buffer and generating a corresponding second parallel input block of data words;

a plurality of second write registers, coupled to said second demultiplexer, storing the second parallel input block of data words;

a plurality of second write drivers, coupled to said second write registers, generating a second parallel block of write data words from the second parallel input block of data words stored in said second write registers; and a second input column decoder, coupled to said second write drivers and said second memory unit, receiving column address information from the shared column decode lines, and selecting at least one of the second columns of each section of the second array, together with one of the second rows of each section of the second array during memory access of said second memory unit as an address for storing the second parallel block of write data words in the second array.

32. The memory access system as in claim 31, further comprising:

a memory controller, coupled to said first and second local row decoders, outputting enable signals to said first and second local row decoders so that only one of said first and second local row decoders is enabled at a time.

33. The memory access system as in claim 32, wherein said first output column decoder includes four 8-to-1 column decoders for outputting in parallel four data words stored in the second array all having an identical column address.

34. The memory access system as in claim 27, further comprises n additional memory units each having memory cells that store data words, each of said n additional memory units being coupled to said shared row decoder, and wherein said shared row decoder outputs row address information for selection of data words stored in said n additional memory units.

35. A method for use in an electronic storage device having a plurality of memory units, each memory unit having at least one array for storing data, the method comprising the steps of:

receiving system address signals corresponding to data stored in one of the plurality of memory units;

decoding said system address signals using a shared decoder which is shared by said memory units, and generating decoded address selection signals; and enabling only one of said memory units at a time using the decoded address selection signals, wherein said enabling step is performed on a memory unit before completion of memory access of a different one of the plurality of memory units.

36. The method as in claim 35, further comprising the steps of:

designating, using a single column decoder shared by said memory units, a column address of at least one data word stored in the memory units; and selecting, using the shared decoder, a row address of a data word stored in said memory units.

37. The method as in claim 36, further comprising the steps of:

upon receiving the row address selected by the shared decoder, locally decoding for each memory unit the row address selected based on a subset of system address signals; and enabling read out of an addressed data word from a selected one of the memory units.

38. The method as in claim 37, further comprising the steps of:

selecting a column address for a data word to be read from an associated memory unit; and selecting a column address for a data word to be written in another associated memory unit.

39. The method as in claim 38, further comprising the step of:

sequentially outputting the data words read from one of said memory units over an associated input-output data path, and sequentially inputting the data words to be stored in one of said memory units through an associated input-output data path.

40. The method as in claim 39, further comprising the step of:

storing the sequentially input data words in a buffer memory in response to an initial write operation, together with the received system address signals corresponding to the input data.

41. The method as in claim 40, further comprising the step of:

writing the input data stored in the buffer memory in an enabled memory unit at an address corresponding to the system address signals stored in the buffer memory during a subsequent write operation.

42. A method for use in an electronic storage device having a plurality of memory units, each memory unit having at least one array or storing data, the method comprising the steps of:

receiving system address signals corresponding to data stored in one of the plurality of memory units;

decoding said system address signals using a shared decoder which is shared by said memory units, and generating decoded address selection signals;

enabling only one of said memory units at a time using the decoded address selection signals;

providing a plurality of system clock cycles; and enabling access to a first one of the memory units during a first clock cycle, and enabling access to a second one of the memory units during a second clock cycle.

43. A method of operating a computer system, the method comprising the steps of:

receiving a first subset of system address signals and designating, using a shared row decoder, a row address in one of a plurality of selectable memory units;

receiving a second subset of system address signals and designating, using a shared column decoder, a column address of said one memory unit;

storing data read from said one memory unit for transmission over input/output data paths;

receiving over input/output data paths data to be stored in another one of said plurality of memory units; and performing, using a central processing unit, a memory access of said memory units one at a time through said input/output data paths, wherein memory access of a given one of said memory units is performed before completion of memory access of another one of said memory units.

44. The method as in claim 43, further comprising the step of providing n memory units, each memory unit having at least one memory array storing data words addressable by the row and column addresses designated by said shared row decoder and said shared column decoder, respectively, wherein n is an integer greater than one.

45. The method as in claim 44, further comprising the step of reading data words from one of the n memory units in a parallel format where the memory unit is a random access memory device.

46. A method of operating a computer system, the method comprising the steps of:

receiving a first subset of system address signals and designating, using a shared row decoder, a row address in one of a plurality of selectable memory units;

receiving a second subset of system address signals and designating, using a shared column decoder, a column address of said one memory unit;

storing data read from said one memory unit for transmission over input/output data paths;

receiving over input/output data paths data to be stored in another one of said plurality of memory units; and performing, using a central processing unit, a memory access of said memory units one at a time through said input/output data paths;

providing a plurality of system clock cycles; and selecting a first one of said plurality of selectable memory units for reading or writing data words from or to the first memory unit during a first clock cycle, and selecting a second one of said plurality of selectable memory units for writing or reading data words to or from the second memory unit during a second clock cycle.

47. The method as in claim 46, further comprising the step of reading data words from or to the first memory unit during the first clock cycle and writing data words from or to the second memory unit during the second clock cycle.

48. The method as in claim 43, further comprising the step of reading the data words from an enabled memory unit and sequentially outputting the data words over an associated output data path, and sequentially inputting the data words to be stored in an enabled memory unit through an associated input data path.

49. A memory access method comprising the steps of:

providing a first memory unit having memory cells that store data words arranged in a first array, the first array having a plurality of sections organized in first rows and first columns;

receiving column address information from shared column decode lines, and selecting one of the first columns in each section of the first array during memory access of said first memory unit;

receiving row address information from shared row decode lines, and selecting one of the first rows of each section of the first array during memory access of said first memory unit;

providing a second memory unit having memory cells that store data words arranged in a second array, the second array having a plurality of sections organized in second rows and second columns;

receiving column address information from the shared column decode lines, and selecting one of the second columns in each section of the second array during memory access of said second memory unit;

receiving row address information from the shared row decode lines, and selecting one of the second rows of each section of the second array during memory access of said second memory unit;

providing a shared row decoder for receiving a first subset of system address signals and transmitting row address information over the shared row decode lines;

in response to a second subset of system address signals and the row address information from the shared row decode lines, selecting one of the first rows of each section of the first array and effecting a memory access of said first memory unit; and in response to a third subset of system address signals and the row address information from the shared row decode lines, selecting one of the second rows of each section of the second array and effecting a memory access of said second memory unit before completion of the memory access of said first memory unit.

50. The memory access method as in claim 49, further comprising the steps of:

sensing and latching in parallel a first plurality of data words stored in the first array at the first column and first row of each section respectively selected in said steps of receiving column address information and receiving row address information;

receiving in parallel the first plurality of data words latched in said step of sensing and latching, and serially outputting the first plurality of data words; and receiving the first plurality of data words serially output from said step of receiving in parallel, and temporarily storing the first plurality of data words prior to output on a first input-output data path.

51. The memory access method as recited in claim 50, further comprising the steps of:

receiving and temporarily storing a first plurality of serial input data words; and generating a corresponding first plurality of parallel input data words.

52. The memory access method as recited in claim 51, further comprising the steps of:

sensing and latching in parallel a second plurality of data words stored in the second array at the second column and second row of each section respectively selected by said step of receiving column address information and receiving row address information;

receiving in parallel the second plurality of data words latched in said step of sensing and latching, and serially outputting the second plurality of data words; and receiving the second plurality of data words serially output from said step of receiving in parallel, and temporarily storing the second plurality of data words prior to output on a second input-output data path.

53. The memory access method as recited in claim 52, further comprising the steps of:

receiving and temporarily storing a second plurality of serial input data words; generating a corresponding second plurality of parallel input data words;

storing the second plurality of parallel input data words;

generating a second plurality of parallel write data words from the second plurality of parallel input data words stored in said second write registers; and receiving column address information from the shared column decode lines, and selecting one of the second columns of each section of the second array during memory access of said second memory unit as an address for storing the second plurality of parallel write data words in the second array.

54. A memory access method comprising the steps of:

providing first memory unit having memory cells that store data words arranged in a first array, the first array having a plurality of sections organized in first rows and first columns;

receiving column address information from shared column decode lines, and selecting one of the first columns in each section of the first array during memory access of said first memory unit;

receiving row address information from shared row decode lines, and selecting one of the first rows of each section of the first array during memory access of said first memory unit;

providing a second memory unit having memory cells that store data words arranged in a second array, the second array having a plurality of sections organized in second rows and second columns;

receiving column address information from the shared column decode lines, and selecting one of the second columns in each section of the second array during memory access of said second memory unit;

receiving row address information from the shared row decode lines, and selecting one of the second rows of each section of the second array during memory access of said second memory unit;

providing a shared row decoder for receiving a first subset of system address signals and transmitting row address information over the shared row decode lines;

in response to a second subset of system address signals and the row address information from the shared row decode lines, selecting one of the first rows of each section of the first array and effecting a memory access of said first memory unit;

in response to a third subset of system address signals and the row address information from the shared row decode lines, selecting one of the second rows of each section of the second array and effecting a memory access of said second memory unit;

sensing and latching in parallel a first of data words stored in the first array at the first column and first row of each section respectively selected in said steps of receiving column address information and receiving row address information;

receiving in parallel the first plurality of data words latched in said step of sensing and latching, and serially outputting the first plurality of data words;

receiving the first plurality of data words serially output from said step of receiving in parallel, and temporarily storing the first plurality of data words prior to output on a first input-output data path;

receiving and temporarily storing a first plurality of serial input data words;

generating a corresponding first plurality of parallel input data words;

sensing and latching in parallel a second plurality of data words stored in the second array at the second column and second row of each section respectively selected by said step of receiving address information and receiving row address information;

receiving in parallel the second plurality of data words latched in said step of sensing and latching, and serially outputting the second plurality of data words; and receiving the second plurality of data words serially output from said step of receiving in parallel, and temporarily storing the second plurality of data words prior to output on a second input-output data path;

receiving and temporarily storing a second plurality of serial input data words;

generating a corresponding second plurality of parallel input data words;

storing the second plurality of parallel input data words;

generating a second plurality of parallel write data words from the second plurality of parallel input data words stored in said second write registers;

receiving column address information from the shared column decode lines, and selecting one of the second columns of each section of the second array during memory access of said second memory unit as an address for storing the second plurality of parallel write data words in the second array;

outputting system clock signals; and during an initial system clock cycle, selecting one of the first rows of each section to allow access of the first array, and during a subsequent system clock cycle, selecting one of the second rows of each section to allow access to said second memory unit.

* * * * *

UNITED STATES PATENT AND TRADEMARK OFFICE
CERTIFICATE OF CORRECTION

PATENT NO.    : 6,128,244
DATED         : October 3, 2000
INVENTOR(S)   : William Thompson et al.

It is certified that error appears in the above-identified patent and that said Letters Patent is hereby corrected as shown below:

Column 10,
Line 54, reads "plurakity", should read -- plurality --;

Column 12,
Line 34, "claim 1" should read -- claim 22 --;

Column 13,
Line 22, "claim 21" should read -- claim 22 --;
Line 26, "claim 21" should read -- claim 22 --;

Column 14,
Line 61, reads "line", should read -- lines --;

Column 15,
Line 15, reads "fist", should read -- first --;

Column 20,
Line 5, reads "providing first", should read -- providing a first --; and
Line 43, reads "first of", should read -- first plurality of --.

Signed and Sealed this

Fourth Day of September, 2001

Attest:

*Nicholas P. Godici*

NICHOLAS P. GODICI
*Attesting Officer*        Acting Director of the United States Patent and Trademark Office